United States Patent
Wang et al.

(10) Patent No.: US 9,406,648 B2
(45) Date of Patent: Aug. 2, 2016

(54) POWER SUPPLY ARRANGEMENT FOR SEMICONDUCTOR DEVICE

(71) Applicant: TAIWAN SEMICONDUCTOR MANUFACTURING COMPANY, LTD., Hsinchu (TW)

(72) Inventors: Chuei-Tang Wang, Taichung (TW); Monsen Liu, Zhudong Township (TW); Sen-Kuei Hsu, Kaohsiung (TW); Chen-Hua Yu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/496,327

(22) Filed: Sep. 25, 2014

(65) Prior Publication Data
US 2016/0093588 A1    Mar. 31, 2016

(51) Int. Cl.
*H01L 23/52* (2006.01)
*H01L 25/065* (2006.01)

(52) U.S. Cl.
CPC ... *H01L 25/0652* (2013.01); *H01L 2225/06513* (2013.01); *H01L 2225/06541* (2013.01)

(58) Field of Classification Search
CPC ............ H01L 2924/14; H01L 23/49805; H01L 23/4985; H01L 23/5286; H01L 27/3297; H01L 2027/11881
USPC .................................. 257/691, 713
See application file for complete search history.

(56) References Cited

U.S. PATENT DOCUMENTS

| 8,716,855 B2* | 5/2014 | Chi ............. H01L 23/50 257/686 |
| 2014/0185264 A1 | 7/2014 | Chen et al. |

* cited by examiner

*Primary Examiner* — Hoai V Pham
(74) *Attorney, Agent, or Firm* — Hauptman Ham, LLP

(57) ABSTRACT

A semiconductor device includes a device die, a first power supply die, and a second power supply die different from the first power supply die. The device die includes a first circuit and a second circuit. The first power supply die is electrically coupled to the first circuit and configured to supply power for the first circuit. The second power supply die is electrically coupled to the second circuit and configured to supply power for the second circuit. The first and second power supply dies are attached to the device die, and overlap the device die in a thickness direction of the device die.

20 Claims, 8 Drawing Sheets

POWER SUPPLY ARRANGEMENT FOR SEMICONDUCTOR DEVICE

BACKGROUND

The recent trend in miniaturizing integrated circuits (ICs) has resulted in smaller devices which consume less power, yet provide more functionality at higher speeds than before. The miniaturization process has also resulted in various considerations, including power supply and distribution to various circuits in an IC in order to ensure intended performance under a variety of load conditions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
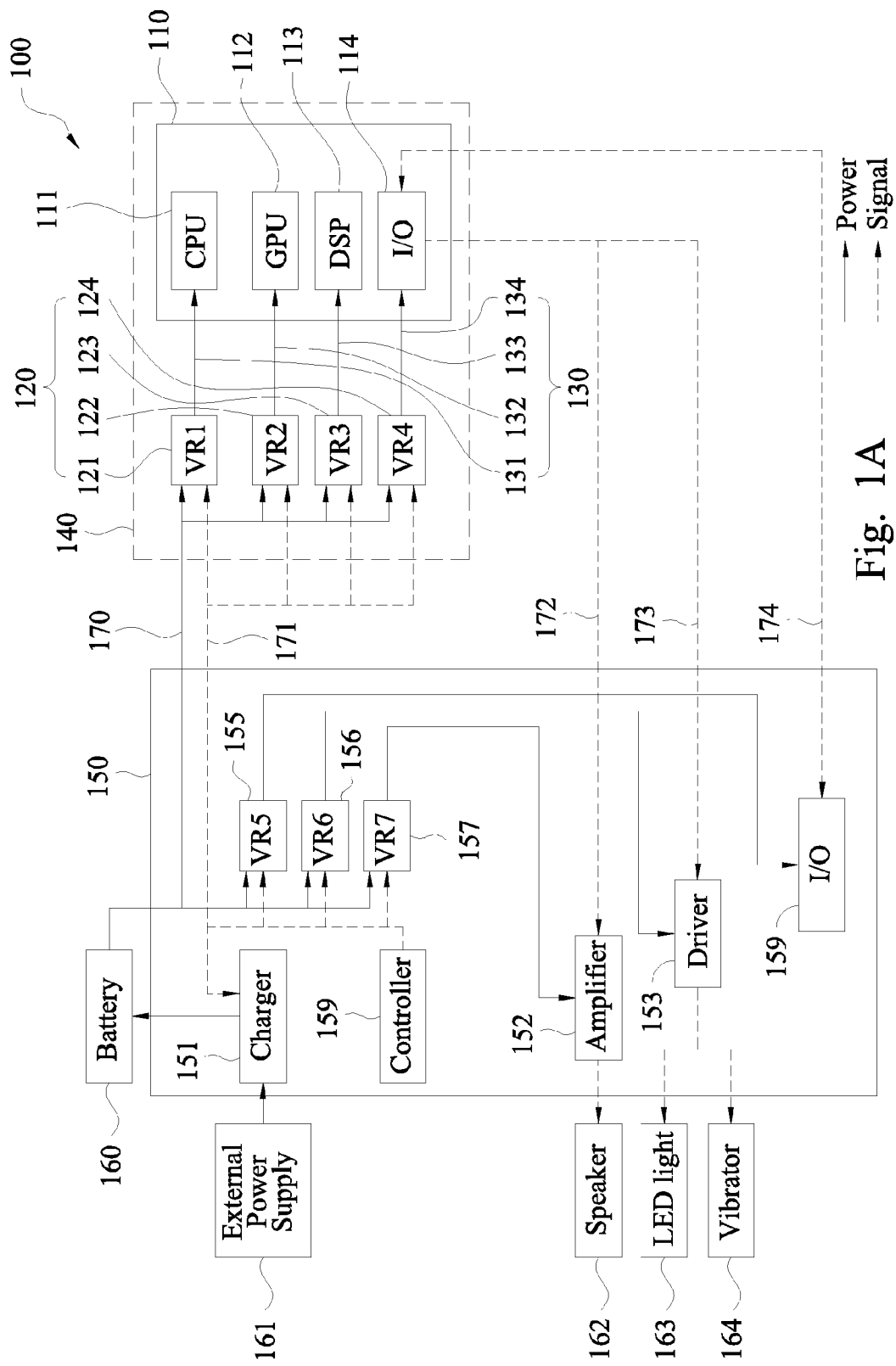
FIG. 1A is a schematic, block diagram of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a first element is described as being "connected" or "coupled" to a second element, such description includes embodiments in which the first and second elements are directly connected or coupled to each other, and also includes embodiments in which the first and second elements are indirectly connected or coupled to each other with one or more other intervening elements in between.

In some embodiments, a power supply die, which is configured to supply power to a circuit in a device die, is attached to the device die. As a result, a length of a power connection path from the power supply die to the circuit is minimized, which results in one or more effects including, but not limited to, low power delivery network (PDN) impedance, small voltage variation, and low power consumption.

FIG. 1A is a schematic, block diagram of a semiconductor device 100 in accordance with some embodiments. The semiconductor device 100 comprises a device die 110 and at least one power supply die 120. The at least one power supply die 120 is connected to the device die 110 via a PDN 130. The device die 110, the at least one power supply die 120, and the PDN 130 are included in a package 140. The device die 110 and the at least one power supply die 120 are electrically coupled to a power management IC (PMIC) 150. In at least one embodiment, the PMIC 150 is implemented in another package separate from the package 140.

In some embodiments, the device die 110 includes a wafer, and one or more active elements over the wafer. In some embodiments, the wafer includes an elementary semiconductor, a compound semiconductor, or an alloy semiconductor. Examples of elementary semiconductors include, but are not limited to, one or more of silicon or germanium. Examples of compound semiconductors include, but are not limited to, one or more of silicon carbide, gallium arsenide, gallium phosphide, indium phosphide, indium arsenide, or indium antimonide. Examples of alloy semiconductors include, but are not limited to, one or more of SiGe, GaAsP, AlInAs, AlGaAs, GaInAs, GaInP, or GaInAsP. In some embodiments, the wafer includes a non-semiconductor material. Examples of non-semiconductor materials include, but are not limited to, one or more of glass, fused quartz, or calcium fluoride. Examples of active elements include, but are not limited to, transistors and diodes. Examples of transistors include, but are not limited to, one or more of metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, or planar MOS transistors with raised source/drains. In some embodiments, the device die 110 further comprises one or more passive elements. Examples of passive elements include, but are not limited to, capacitors, inductors, fuses, and resistors.

The active elements and/or passive elements in the device die 110 are electrically coupled with each other to define one or more circuits configured to perform various functions. In the example configuration in FIG. 1A, the circuits in the device die 110 include a central processing unit (CPU) 111, a graphics processing unit (GPU) 112, a digital signal processor (DSP) 113, and an input/output (I/O) module 114. Where appropriate, the CPU 111, GPU 112, DSP 113 and I/O module 114 are referred to herein as circuits 111-114. The circuits 111-114 define an application processor (AP) in the device die 110. In at least one embodiment, the AP is configured as an application specific IC (ASIC) for a wireless communication application or device. The number and/or types of circuits in the device die 110 described with respect to FIG. 1A are examples. Other arrangements are within the scope of various embodiments. For example, in at least one embodiment, two or more CPUs are included in the device die 110 in a multi-core arrangement. In at least one embodiment, the circuits in the device die 110 include an internal memory.

The at least one power supply die 120 is electrically coupled to a corresponding circuit in the device die 110 to supply power to the corresponding circuit. In the example configuration in FIG. 1A, the at least one power supply die 120 comprises power supply dies 121, 122, 123 and 124. The power supply dies 121, 122, 123 and 124 are electrically coupled to corresponding CPU 111, GPU 112, DSP 113 and I/O module 114 in the device die 110, via corresponding power connection paths 131, 132, 133 and 134 of the PDN 130. The power supply dies 121, 122, 123 and 124 are different dies which are attached to the device die 110 as described herein. The number of power supply dies attached to the device die 110 as described with respect to FIG. 1A is an example. Other arrangements are within the scope of various embodiments.

Various circuits in the device die 110 have various power supply specifics. In at least one embodiment, the operating voltage of one circuit is different from the operating voltage of another circuit. For example, the operating voltage of the CPU 111 is different from, e.g., lower than, the operating voltage of the I/O module 114. In at least one embodiment, the power supply voltage for one circuit is to be kept at a level steadier, or more constant, than for another circuit. For example, the power supply voltage for the I/O module 114 is permitted to have voltage variations larger than those acceptable for intended performance of the CPU 111. In at least one embodiment, a circuit has different operating modes with different operating voltages. For example, the CPU 111 is operable at different modes with different operating voltages, such as a high-performance mode with a higher operating voltage, and a power-saving mode with a lower operating voltage. In a multi-core arrangement in accordance with at least one embodiment, at least one CPU (or core) is turned off in a power-saving mode.

To accommodate power supply specifics of at least one circuit in the device die 110, the at least one power supply die 120 includes at least one voltage regulator configured in accordance with the power supply specifics of the corresponding circuit. In the example configuration in FIG. 1A, the at least one power supply die 120 comprises voltage regulators VR1, VR2, VR3 and VR4 which are arranged on corresponding power supply dies 121, 122, 123 and 124, and configured to supply power for the corresponding CPU 111, GPU 112, DSP 113 and I/O module 114, via corresponding power connection paths 131, 132, 133 and 134. The voltage regulators VR1, VR2, VR3 and VR4 are configured in accordance with the power supply specifics of the corresponding circuits. For example, when a common power supply voltage, e.g., from a battery as described herein, is supplied to the voltage regulators VR1-VR4, the voltage regulators VR1-VR4 adjust the voltage level of the common power supply voltage to generate different power supply voltages for the corresponding circuits 111-114. In another example, the voltage regulator VR1 for the CPU 111 is configured to provide a lower and steadier power supply voltage than a power supply voltage provided by the VR4 for the I/O module 114. In at least one embodiment, the voltage regulator VR1 is configured to switch the power supply voltage for the CPU 111 between a higher voltage level corresponding to a high-performance mode and a lower voltage level corresponding to a power-saving mode. In at least one embodiment, the voltage regulator VR1 is configured to turn off the CPU 111, e.g., by stopping power supply to the CPU 111, in the power-saving mode. Various voltage regulator configurations are within the scope of various embodiments. Example voltage regulator configurations include, but are not limited to, linear voltage regulator, switching voltage regulator, buck converter and the like. In some embodiments, at least one of the voltage regulators VR1-VR4 is implemented by active elements and/or passive elements on a wafer of the corresponding power supply die, as described herein with respect to the circuits of the device die 110. The number and/or types of voltage regulators in the at least one power supply die 120 described with respect to FIG. 1A are examples. Other arrangements are within the scope of various embodiments.

The PMIC 150 is implemented as a power management die different from the at least one power supply die 120 and the device die 110. In the example configuration in FIG. 1A, the PMIC 150 comprises a charger 151, an amplifier 152, a driver 153, a I/O module 154, voltage regulators 155, 156, 157 (indicated as corresponding VR5, VR6, VR7), and a controller 159. The charger 151 is configured to charge a rechargeable battery 160 using power received from an external power supply 161 when the external power supply 161 is electrically coupled to the PMIC 150. In at least one embodiment, the battery 160 comprises a battery of a wireless communication device, such as a cell phone. In at least one embodiment, the external power supply 161 is electrically coupled to the charger 151 via a Universal Serial Bus (USB) port having a nominal voltage of 5 V. The amplifier 152 is configured to drive a speaker 162. The driver 153 is configured to drive various external devices, such as a light emitting diode (LED) light 163 and a vibrator 164. In at least one embodiment, the LED light 163 is a light source of a display of a wireless communication device, such as a cell phone. The I/O module 154 is configured for data input/output between the PMIC 150 and the circuits on the device die 110, and between the PMIC 150 and other external circuitry. The voltage regulators 155, 156 and 157 are configured to supply power for the corresponding amplifier 152, driver 153 and I/O module 154, using the power received from the battery 160. In at least one embodiment, when the external power supply 161 is electrically coupled to the PMIC 150, one or more of the voltage regulators 155, 156 and 157 receive power from the external power supply 161 in place of or in addition to the power receive from the battery 160. The controller 159 is configured to control operations of one or more other components in the PMIC 150. In the example configuration in FIG. 1A, the controller 159 is configured to control operation of the charger 151 and voltage regulators 155, 156 and 157. In at least one embodiment, the controller 159 receives power from the battery 160. In at least one embodiment, the controller 159 receives power from the battery 160 via a dedicated voltage regulator (not shown). The described configuration of the PMIC 150 is an example. Other arrangements are within the scope of various embodiments. For example, in one or more embodiments, the charger 151 is implemented as an external component outside the PMIC 150. In another example, one or more of the components described with respect to the PMIC 150 in FIG. 1A is/are omitted.

The PMIC 150 is electrically coupled to the device die 110 and the at least one power supply die 120. For example, the PMIC 150 is electrically coupled to the at least one power supply die 120 via a power connection 170 and a signal connection 171. The PMIC 150 is also electrically coupled to the device die 110 via signal connections 172, 173, 174 for signal communications between the I/O module 114 in the device die 110 and the amplifier 152, driver 153 and I/O module 154 in the PMIC 150. In some embodiments, the power connection 170 and the signal connections 171-174 are implemented as conductive traces or other types of conductors on a substrate on which the PMIC 150 and the package 140 are mounted, as described herein.

The PMIC 150 is configured to provide at least one of power or a control signal to the at least one power supply die 120. In the example configuration in FIG. 1A, power is delivered from the battery 160, via the PMIC 150 and the power connection 170, to the at least one power supply die 120, and then from the voltage regulators on the at least one power supply die 120 to the corresponding circuits of the device die 110. In at least one embodiment, power is delivered from the battery 160 to the at least one power supply die 120, bypassing the PMIC 150. In the example configuration in FIG. 1A, at least one control signal is generated by the controller 159 and provided via the signal connection 171 to one or more voltage regulators on the at least one power supply die 120. Examples of such control signal include, but are not limited to, an enabling signal for turning ON the corresponding voltage regulator, a disabling signal for turning OFF the corresponding voltage regulator, a switching signal for switching a level of a power supply voltage outputted by the corresponding voltage regulator, and other control signals for controlling one or more operational characteristics of the corresponding voltage regulator. In at least one embodiment, a control signal and/or signal connection from the PMIC 150 to one or more of the voltage regulators on the at least one power supply die 120 is omitted.

As described herein, the PDN 130 is arranged to deliver and distribute power to various circuits in the device die 110. Impedance of the PDN 130 (hereinafter "PDN impedance")" is a design consideration, because the PDN impedance potentially affects one or more characteristics of the semiconductor device 100, including, but not limited to, performance, power consumption, and voltage variation. The PDN impedance depends on the lengths of the power connection paths 131, 132, 133 and 134. The shorter the lengths of the power connection paths 131, 132, 133 and 134, the lower the PDN impedance and the better the power performance of the semiconductor device 100. In some embodiments, by arranging the power supply dies 121-124 with the corresponding voltage regulators VR1-VR4 as close as practically possible to the corresponding circuits 111-114 of the device die 110, it is possible to minimize the lengths of the power connection paths 131-134 and improve PDN impedance of the semiconductor device 100.

Figure 1B:
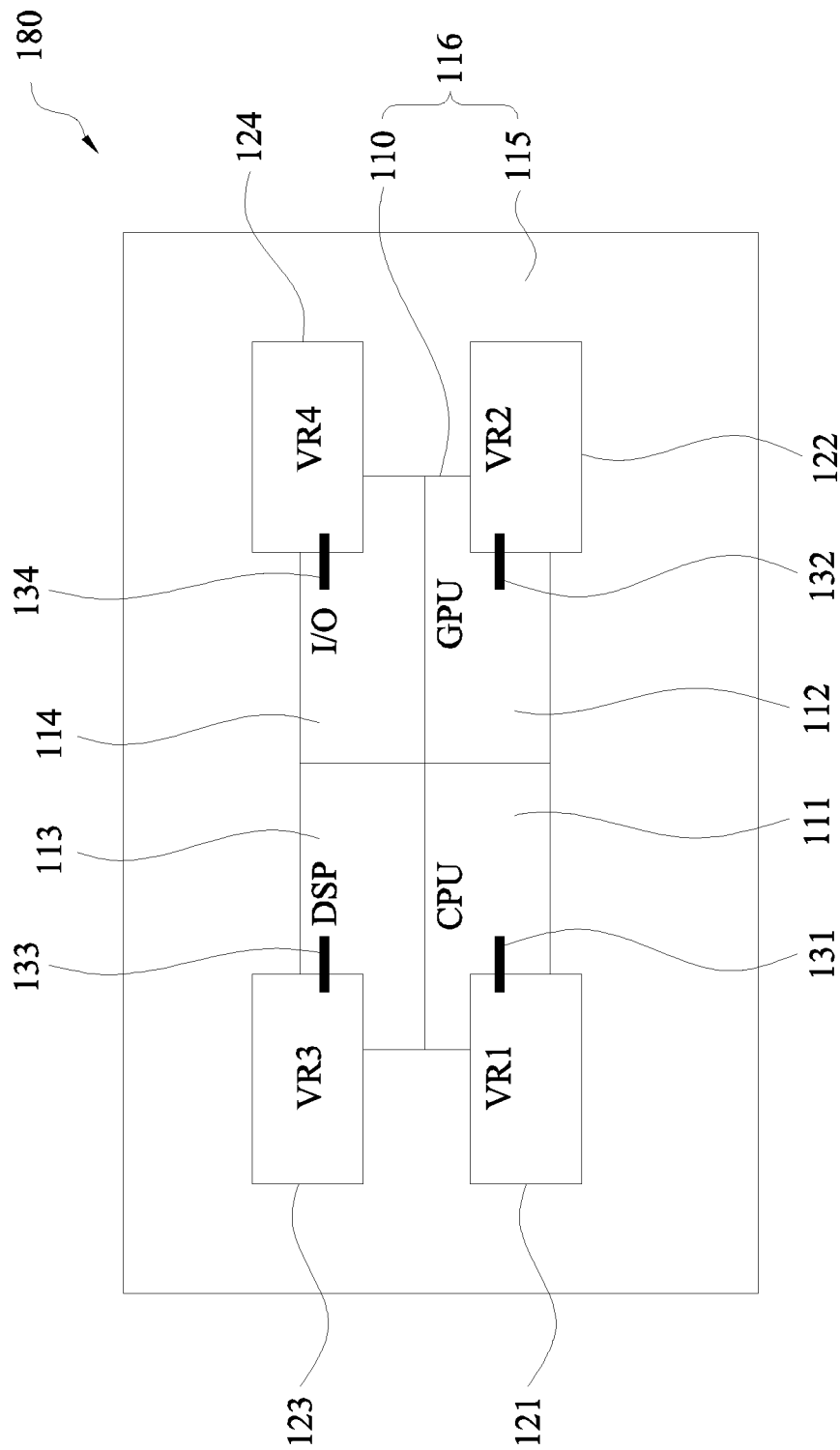
FIGS. 1B and 1C are schematic, plan views of various semiconductor devices in accordance with some embodiments.

FIG. 1B is a schematic, plan view of a semiconductor device 180 in accordance with some embodiments. The semiconductor device 180 includes a device die 110 with circuits 111-114, and corresponding voltage regulators VR1-VR4 on corresponding power supply dies 121-124 as described with respect to FIG. 1A. The semiconductor device 180 further comprises a molding material 115 which encapsulates, at least partially, the device die 110. The device die 110 and the molding material 115 define a chip package 116. In the plan view of FIG. 1B, the power supply dies 121-124 have sizes smaller than a size of the device die 110. For example, each of the power supply dies 121-124 has at least one of a length, a width, or an area smaller than the corresponding length, width, or area of the device die 110. In at least one embodiment, each of the power supply dies 121-124 has a size and a shape that permit the power supply die to be arranged, in plan view, completely within an outer periphery of the device die 110. The power supply dies 121-124 are mounted over a surface of the chip package 116 to overlap the corresponding circuits 111-114 in a thickness direction of the device die 110 (i.e., in a direction normal to the paper plane of FIG. 1B). As a result, the length of the power connection paths 131-134 between the power supply dies 121-124 and the corresponding circuits 111-114 are reduced, which, in turn, reduces the PDN impedance of the semiconductor device 100. The arrangement described with respect to FIG. 1B is an example. Other arrangements are within the scope of various embodiments. For example, in at least one embodiment, the molding material 115 is omitted, and the power supply dies 121-124 are mounted over a surface of the device die 110 and within a periphery of the device die 110.

Figure 1C:
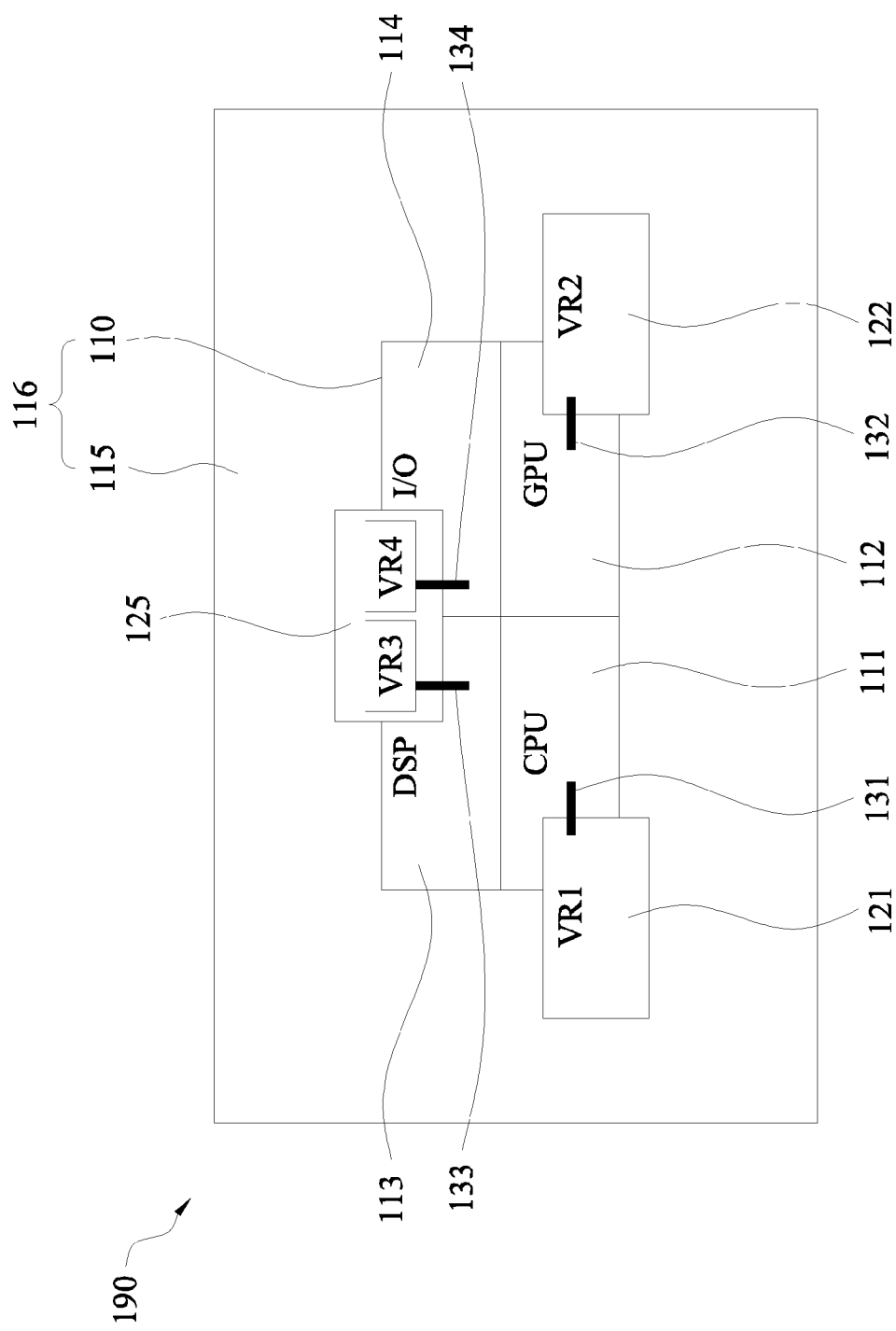

FIG. 1C is a schematic, plan view of a semiconductor device 190 in accordance with some embodiments. The semiconductor device 190 includes a molding material 115, a device die 110 with circuits 111-114, and corresponding voltage regulators VR1-VR4, as described with respect to FIGS. 1A-1B. In the semiconductor device 190, more than one voltage regulators are implemented in a single power supply die which is mounted to overlap at least one of the corresponding circuits, in the thickness direction of the device die 110. For example, the voltage regulators VR3 and VR4 are implemented in a single power supply die 125 which is mounted to overlap the corresponding DSP 113 and I/O module 114. The arrangement described with respect to FIG. 1C is an example. Other arrangements are within the scope of various embodiments.

For example, in at least one embodiment, all voltage regulators for the circuits of the device die 110 are implemented in a single power supply die which is mounted to overlap the device die 110 in the thickness direction of the device die 110. In one or more embodiments, the voltage regulators VR1-VR4 are physically arranged on the single power supply die to be as close as practically possible to the corresponding circuits 111-114 to minimize the lengths of the corresponding power connection paths 131-134, and the PDN impedance of the semiconductor device.

Figure 2:
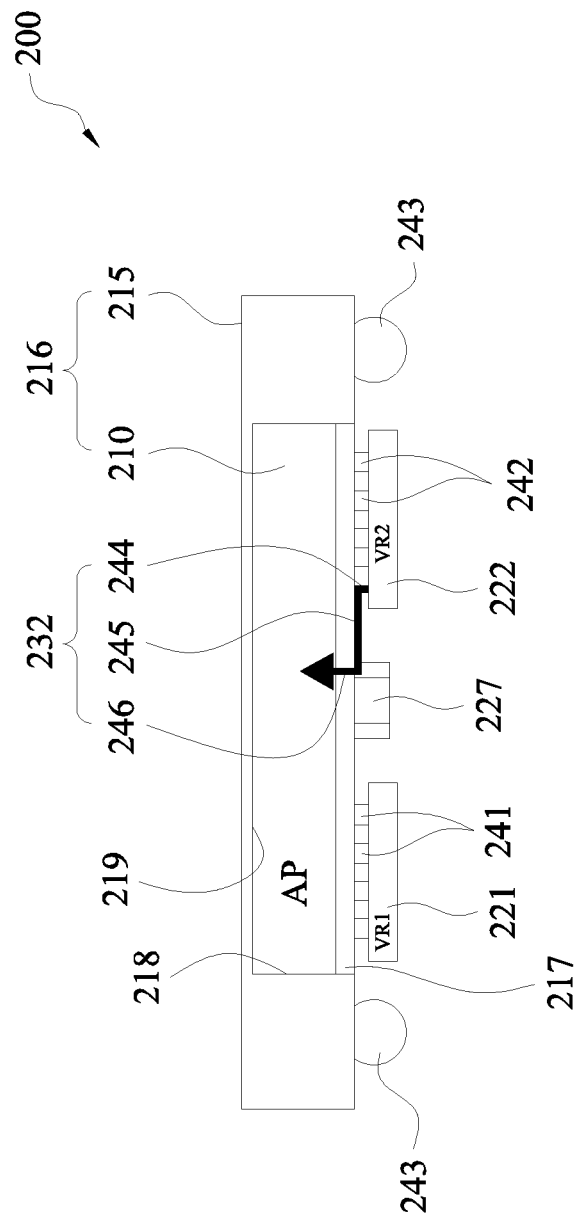
FIG. 2 is a schematic, cross-sectional view of a semiconductor device in accordance with some embodiments.

FIG. 2 is a schematic, cross-sectional view of a semiconductor device 200 in accordance with some embodiments. The semiconductor device 200 comprises a device die 210 embedded in a molding material 215 to define a chip package 216, and power supply dies 221 and 222 attached to a surface of the chip package 216. The power supply dies 221 and 222 comprise corresponding voltage regulators VR1 and VR2 for regulating and supplying power to corresponding circuits of the device die 210. In at least one embodiment, the device die 210, molding material 215, chip package 216, power supply die 221, and power supply die 222 correspond to the device die 110, molding material 115, chip package 116, power supply die 121 and power supply die 122 described with respect to one or more of FIGS. 1A-1C. In at least one embodiment, the semiconductor device 200 corresponds to the package 140 described with respect to FIG. 1A.

The device die 210 comprises a re-distribution layer (RDL) 217 on a surface, e.g., the bottom face in FIG. 2, which is not covered by the molding material 215. The remaining faces of the device die 210, i.e., the side face 218 and the top face 219, are covered by the molding material 215. The RDL 217 comprises one or more conductive layers alternating with dielectric layers and is configured to provide electrical connections from external circuitry to the circuits in the device die 210, e.g., a CPU, GPU, DSP or I/O module. In some embodiments, the RDL 217 is formed by depositing one or more conductive layers, patterning the one or more conductive layers, and filling spaces between the resulting conductive patterns with one or more dielectric layers. In some embodiments, one or more conductive layers in the RDL 217 comprise a metal or a metal alloy including aluminum, copper, tungsten, and/or alloys thereof. In some embodiments, the RDL 217 has at least one portion extending over a surface of the molding material 215 and beyond an outer periphery of the device die 210 to provide electrical connections to conductive bumps 243 as described herein.

The power supply die 221 and power supply die 222 include the corresponding voltage regulator VR1 and voltage regulator VR2 described with respect to FIG. 1A. In at least one embodiment, the power supply voltages provide by the voltage regulator VR1 and voltage regulator VR2 are different in accordance with different operating voltages of the corresponding circuits in the device die 210. In at least one embodiment, the voltage regulator VR1 and voltage regulator VR2 are configured to provide the same power supply voltage, for example, when the corresponding circuits in the device die 210 are of the same type, e.g., two cores in a multi-core arrangement. In at least one embodiment, by arranging two different voltage regulators for two different circuits (even though the circuits have the same operating voltage), each of the voltage regulators is placed as close as practically possible to the corresponding circuit to shorten the corresponding power connection paths from the voltage regulators to the corresponding circuits and improve PDN impedance. In the example configuration of FIG. 2, a decoupling capacitor 227 is coupled to the device die 210 via the RDL 217 to further improve PDN impedance. Examples of the decoupling capacitor 227 include, but are not limited to, a solid tantalum capacitor, an aluminum-polymer capacitor, an aluminum electrolytic capacitor, a special polymer capacitor, and a multiple layer ceramic capacitor (MLCC). In at least one embodiment, the decoupling capacitor 227 is omitted.

The power supply dies 221 and 222 are connected to the RDL 217 of the device die 210 via corresponding conductive bumps 241 and 242. Examples of conductive bumps 241 and 242 include, but are not limited to, metal pillars, and controlled collapse chip connection (C4) bumps. In at least one embodiment, the metal pillars comprise copper pillars. Conductive bumps 243 are formed on the chip package 216 and electrically coupled to the circuits in the device die 210 via the extended portion of the RDL 217 over the molding material 215. The conductive bumps 243 are arranged to surround the outer periphery of the device die 210 in a fan-out arrangement. The conductive bumps 243 also surround the power supply dies 221, 222. Examples of conductive bumps 243 include, but are not limited to, solder balls arranged in a ball grid array (BGA).

The power supply dies 221, 222 are electrically coupled to the corresponding circuits in the device die 210 via the corresponding conductive bumps 241, 242 and the RDL 217. For example, the voltage regulator VR2 in the power supply die 222 is electrically coupled to the corresponding circuit in the device die 210 via a power connection path 232 which, in one or more embodiments, corresponds to the power connection path 132 described with respect to FIGS. 1A-1C. The power connection path 232 includes a first vertical portion 244, a horizontal portion 245 and a second vertical portion 246. The first vertical portion 244 corresponds to a height of the corresponding conductive bump 243 in the thickness direction of the device die 210. The horizontal portion 245 corresponds to a horizontal extension of the power connection path 232 in the RDL 217. In some embodiments, the horizontal portion 245 corresponds to a total of horizontal extensions of the power connection path 232 in more than one conductive layers of the RDL 217. The second vertical portion 246 corresponds to a vertical extension of the power connection path 232 in the RDL 217. In some embodiments, the second vertical portion 246 corresponds to a total of vertical extensions of the power connection path 232 across more than one conductive and/or dielectric layers of the RDL 217.

In some embodiments, the height of the conductive bumps 241, 242 is in the range from 20 to 100 μm (microns), and the total thickness of the layers in the RDL 217 is about the same as the height of the conductive bumps 241, 242. As a result, a combined length of the first vertical portion 244 and the second vertical portion 246 is in the range from 40 to 200 μm. This combined length in the thickness direction of the device die 210 is not significantly dependent on a location, in plan view, of the power supply die 222 relative to the device die 210. The overall length of the power connection path 232 depends on a length of the horizontal portion 245. The shorter the length of the horizontal portion 245, the shorter the overall length of the power connection path 232 and the smaller the PDN impedance. In some embodiments, by arranging the power supply die 222 to overlap, or as close as practically possible to, the corresponding circuit in the device die 210, the length of the horizontal portion 245 is shortened and the PDN impedance is improved.

In some embodiments, the overall length of the power connection path 232 is 500 μm or less. With such a length of power connection path, it is possible in one or more embodiments to achieve one or more effects including, but not limited to, small direct current (DC) PDN impedance, small alternating current (AC) PDN impedance, low voltage variation, short transient time, and low power consumption. With the achievement with one or more of such effects, the semiconductor device is suitable, in one or more embodiments, for high frequency applications, such as applications over the 1.5 GHz band. When the overall length of the power connection path 232 is greater than 500 μm one or more of the described effects is potentially not achievable.

Compared to other approaches where lengths of power connection paths between voltage regulators and the corresponding circuits in the device die are in the millimeter scale, i.e., at least 1000 the semiconductor devices in accordance with some embodiments provide improved PDN impedance and one or more associated effects. For example, the longer power connection path length in other approaches leads to high PDN impedance which potentially causes high voltage variations and high power consumption. High voltage variations caused by the driving of a circuit in the device die potentially causes mis-operations in other circuits of the device die. To reduce the PDN impedance associated with long power connection paths, other approaches use multiple decoupling capacitors which, in turn, increase cost and/or size of the semiconductor device. The high PDN impedance in other approaches further results in long transient times which, in turn, cause slow response and increased power consumption, making other approaches potentially unsuitable for dynamic power applications where a circuit in the device die is frequently turned ON and OFF. With reduced PDN impedance in accordance with some embodiments, it is possible to address one or more of the above-described potential concerns. For example, low PDN impedance in at least one embodiment reduces one or more of voltage variation, transient time, power consumption, usage of decoupling capacitors, and risk of mis-operation, and/or renders the semiconductor device in at least one embodiment suitable for dynamic power applications.

Figure 3:
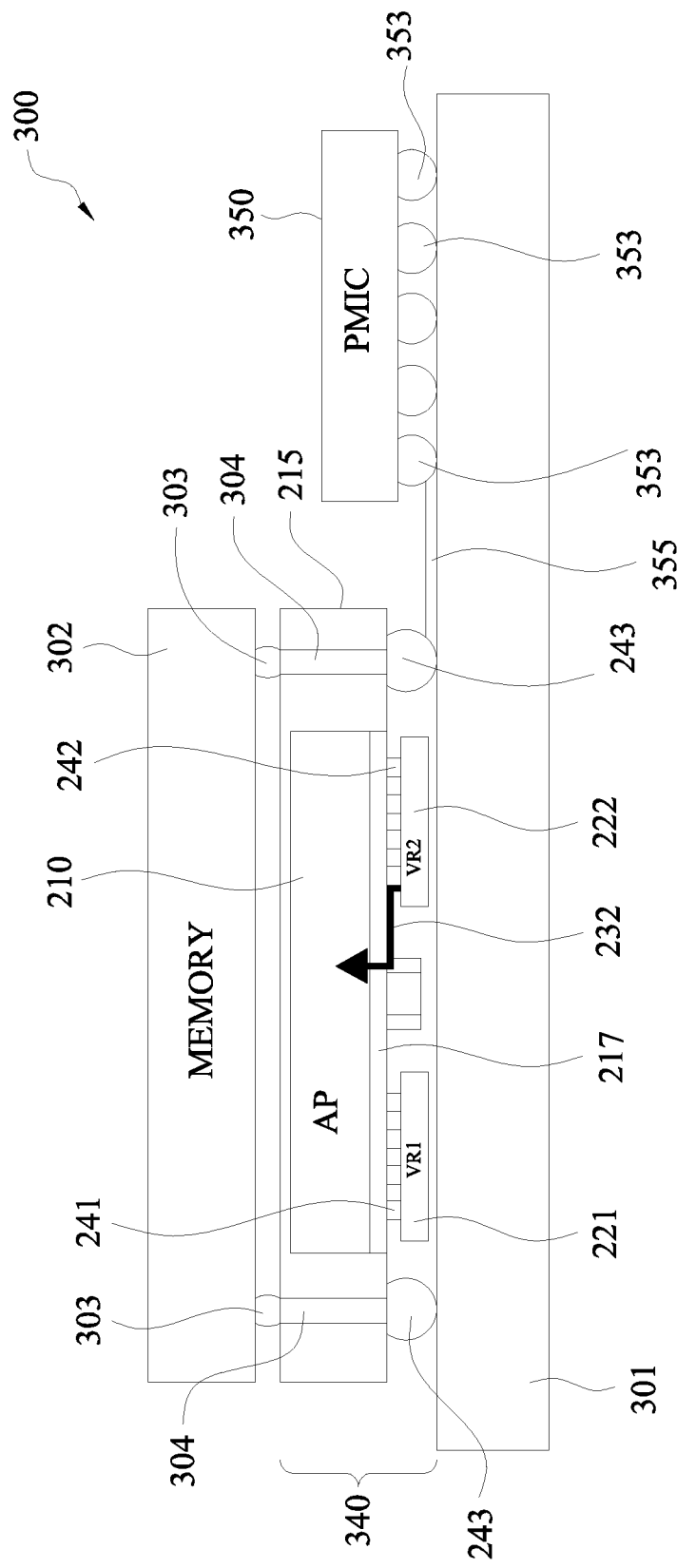
FIGS. 3-6 are schematic, cross-sectional views of various semiconductor devices in accordance with some embodiments.

FIG. 3 is a schematic, cross-sectional view of a semiconductor device 300 in accordance with some embodiments. The semiconductor device 300 comprises a substrate 301, a memory 302, a package 340 and a PMIC 350. In some embodiments, the package 340 corresponds to the semiconductor device 200 described with respect to FIG. 2, and comprises a device die 210, and power supply dies 221, 222 attached to the device die 210. In some embodiments, the PMIC 350 corresponds to the PMIC 150 described with respect to FIG. 1A.

In at least one embodiment, the substrate 301 includes a printed circuit board (PCB). Other substrate configurations are within the scope of various embodiments.

The memory 302 is mounted over the package 340 by conductive bumps 303. The package 340 further comprises through vias 304 extending through the molding material 215 and electrically coupling the conductive bumps 303 to the corresponding conductive bumps 243. Examples of conductive bumps 303 include, but are not limited to, metal pillars, C4 bumps, and solder bumps. In at least one embodiment, the memory 302 comprises a Random Access Memory (RAM), a flash memory, a Read Only Memory (ROM), an Electrically Programmable ROM (EPROM), an Electrically Erasable Programmable ROM (EEPROM). Other memory configurations are within the scope of various embodiments. In at least one embodiment, the memory 302 is omitted.

The package 340 with the memory 302 mounted thereon is mounted on the substrate 301 via the conductive bumps 243. The PMIC 350 is mounted on the substrate 301 via conductive bumps 353. Examples of conductive bumps 353 include, but are not limited to, solder balls. In the example configuration in FIG. 3, the PMIC 350 and the package 340 are mounted on the same side of the substrate 301, and are electrically coupled to each other via at least one conductor 355 and the corresponding conductive bumps 243 and 353. Other arrangements are within the scope of various embodiments. For example, in at least one embodiment, the package 340 and the PMIC 350 are mounted on opposite sides of the substrate 301. To electrically connect the package 340 and PMIC 350 in such arrangement, one or more conductors, such as vias, are formed through the substrate 301.

In the example configuration in FIG. 3, the at least one conductor 355 corresponds to at least one of the power connection 170 or the signal connection 171 described with respect to FIG. 1A. In at least one embodiment, power is delivered from the PMIC 350, via the at least one conductor 355 and one or more corresponding conductive bumps 243, the RDL 217, one or more corresponding conductive bumps 241, 242 to the corresponding voltage regulators VR1, VR2. The voltage regulators VR1, VR2 regulate the received power, e.g., by adjusting the voltage level, and supply corresponding power supply voltages to the corresponding circuits in the device die 210 via the corresponding conductive bumps 241, 242.

In other approaches where voltage regulators are incorporated in a PMIC which is mounted side-by-side a device die, the lengths of power connection paths from the voltage regulators in the PMIC to the corresponding circuits in the device die include a spacing between the device die and the PMIC. Such a spacing is at least 1 mm (millimeter) in some situations, making the lengths of power connection paths in other approaches longer than 1 mm, which potentially causes one or more associated concerns described herein. In contrast, by implementing voltage regulators on at least one power supply die separate from the PMIC and attaching the at least one power supply die to the device die in accordance with some embodiments, the lengths of the power connection paths are brought down to the micron scale with one or more advantages described herein. In addition, by arranging the power supply dies to overlap the device die in the thickness, some embodiments reduce the form factor of the semiconductor device compared to the other approaches of arranging the PMIC and device die side-by-side.

In other approaches where voltage regulators are incorporated in a PMIC which is mounted opposite a device die across a PCB, the lengths of power connection paths from the voltage regulators in the PMIC to the corresponding circuits in the device die include a thickness of the PCB, and double heights of BGA balls that connect the device die and the PMIC to the opposite sides of the substrate. In some situations, the thickness of the PCB is about 800 μm and the height of BGA balls is about 200 resulting in power connection path lengths of at least 1.2 mm, which potentially causes one or more associated concerns described herein. In contrast, by implementing voltage regulators on at least one power supply die separate from the PMIC and attaching the at least one power supply die to the device die in accordance with some embodiments, the lengths of the power connection paths are brought down to the micron scale with one or more advantages described herein.

Figure 4:
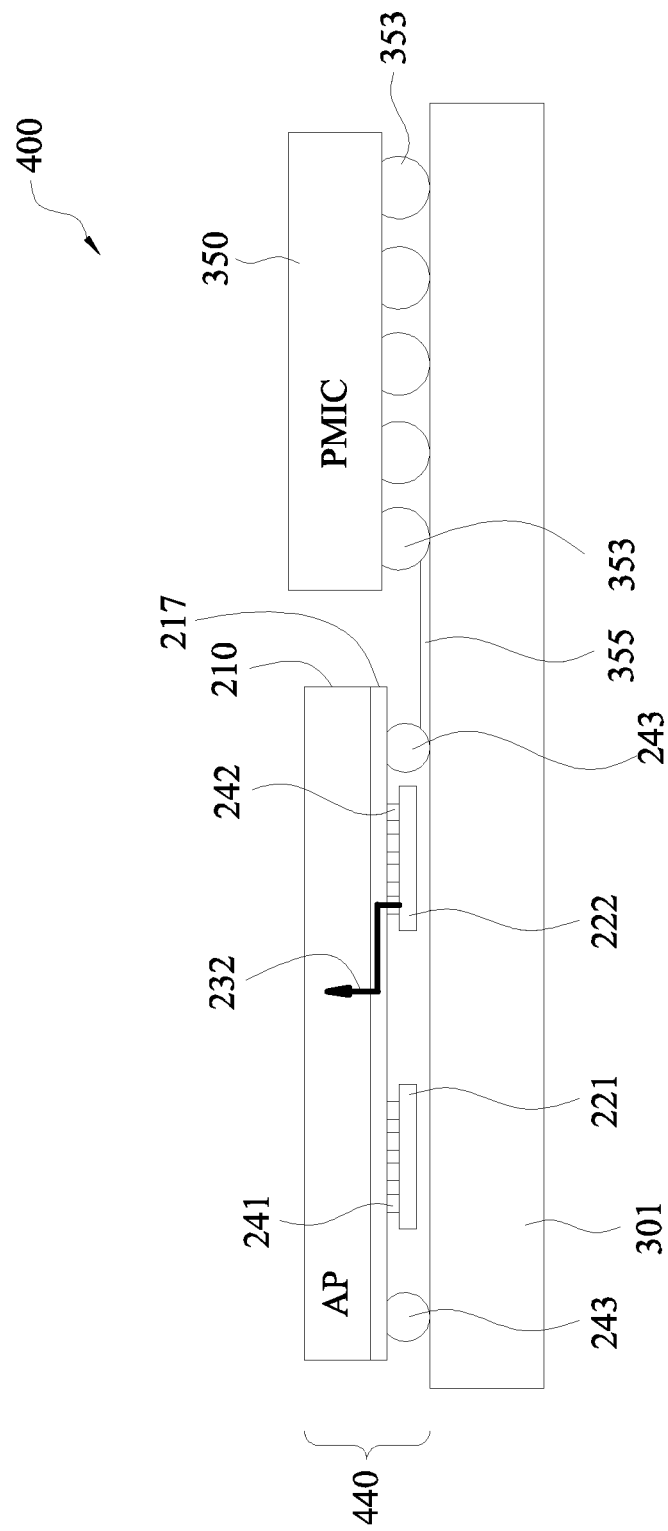

FIG. 4 is a schematic, cross-sectional view of a semiconductor device 400 in accordance with some embodiments. Compared to the semiconductor device 300, the semiconductor device 400 comprises a package 440 instead of the package 340, and the memory 302 is omitted. The package 440 includes a device die 210 and power supply dies 221, 222 attached to the device die 210 as described with respect to the semiconductor device 200 in FIG. 2. Compared to the semiconductor device 200 which includes a fan-out arrangement with conductive bumps 243 arranged outside the outer periphery of the device die 210 in plan view, the package 440 includes a fan-in arrangement with the conductive bumps 243 arranged within the outer periphery of the device die 210 in plan view, and the molding material 215 is omitted. The conductive bumps 243 surround the power supply dies 221, 222. The semiconductor device 400 operates and achieves one or more effects as described herein with respect to one or more of FIGS. 1A-1C, 2 and 3.

Figure 5:
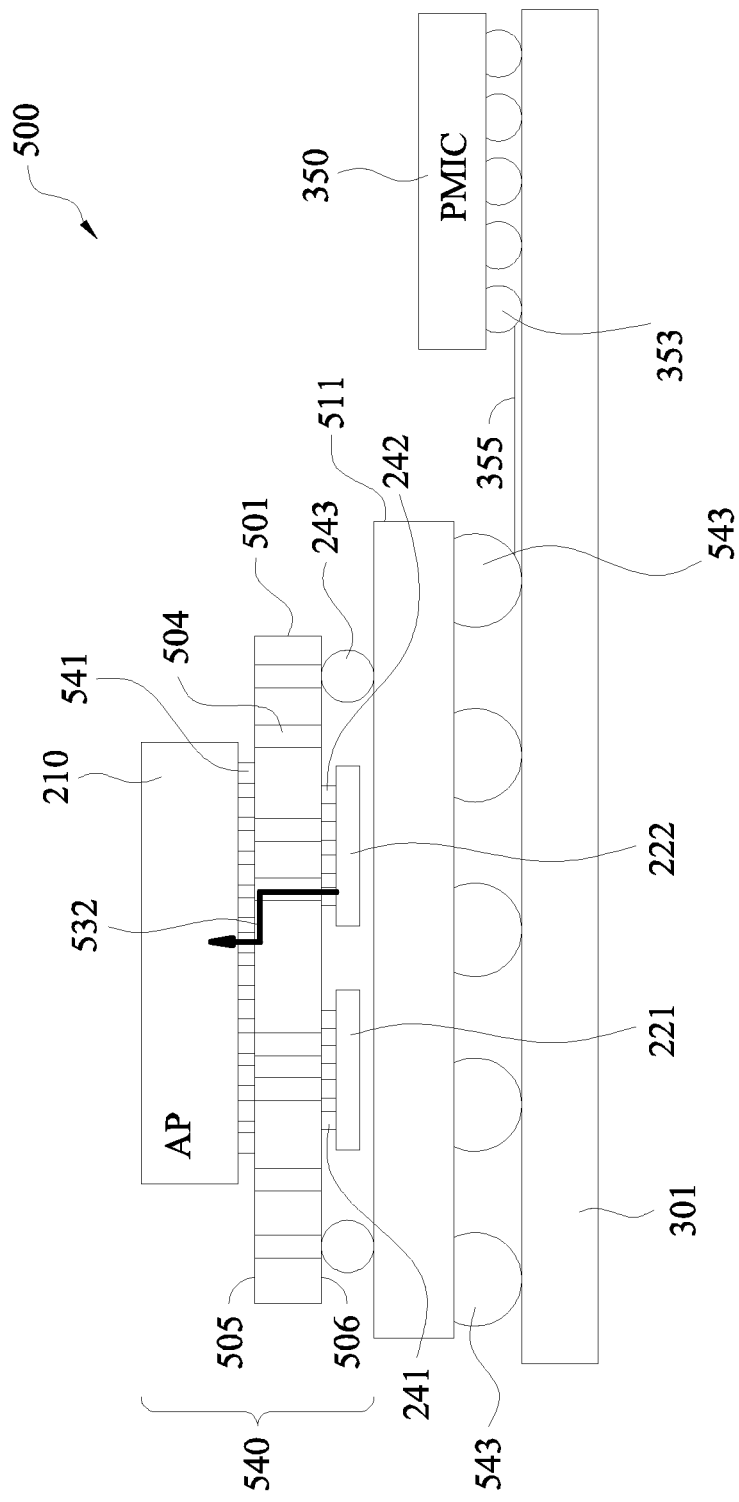

FIG. 5 is a schematic, cross-sectional view of a semiconductor device 500 in accordance with some embodiments. Compared to the semiconductor device 400, the semiconductor device 500 comprises a package 540 instead of the package 440, and the package 540 is mounted over the substrate 301 via a further substrate 511 and conductive bumps 543. In at least one embodiment, the further substrate 511 comprises an organic substrate. Other substrate configurations are within the scope of various embodiments. Examples of conductive bumps 543 include, but are not limited to, solder balls. In at least one embodiment, the further substrate 511 and conductive bumps 543 are omitted, and the package 540 is mounted over the substrate 301 via the conductive bumps 243 as described with respect to FIGS. 3 and 4.

Compared to the package 440, the package 540 includes an interposer 501 between the device die 210 and power supply dies 221, 222. In addition, the RDL 217 is omitted from the device die 210. In at least one embodiment, the interposer 501 includes one or more active elements and is referred to as an active interposer. In at least one embodiment, the interposer 501 does not include active elements and is referred to as a passive interposer. The interposer 501 includes through-silicon vias (TSVs) 504 extending from an upper side 505 facing the device die 210 to a lower side 506 facing the power supply dies 221, 222. The interposer 501 further comprises a RDL (not shown) on the upper side 505. Compared to embodiments where contact pads of the device die 210 are coupled to external circuitry via the RDL 217, contact pads of the device die 210 in the semiconductor device 500 are directly attached to conductive bumps 541 which, in turn, are attached to the RDL on the upper side 505 of the interposer 501. The RDL of the interposer 501 is further connected, via the TSVs 504, to the conductive bumps 241, 242 and the corresponding power supply dies 221, 222, and also to the conductive bumps 243. Examples of conductive bumps 541 include, but are not limited to, copper pillars, and C4 bumps.

Compared to embodiments where an interposer is not used, a power connection path 532 between a voltage regulator, e.g., voltage regulator VR2 on the power supply die 222, and the corresponding circuit in the device die 210 of the semiconductor device 500 includes an additional length corresponding to a height of the TSVs 504 or the thickness of the interposer 501. In some embodiments, the thickness of the interposer 501 is not greater than 100 µm, making it possible to still keep the power connection path length in an intended range, for example, not greater than 500 µm. The semiconductor device 500 operates and achieves one or more effects as described herein with respect to one or more of FIGS. 1A-1C, and 2-4.

Figure 6:
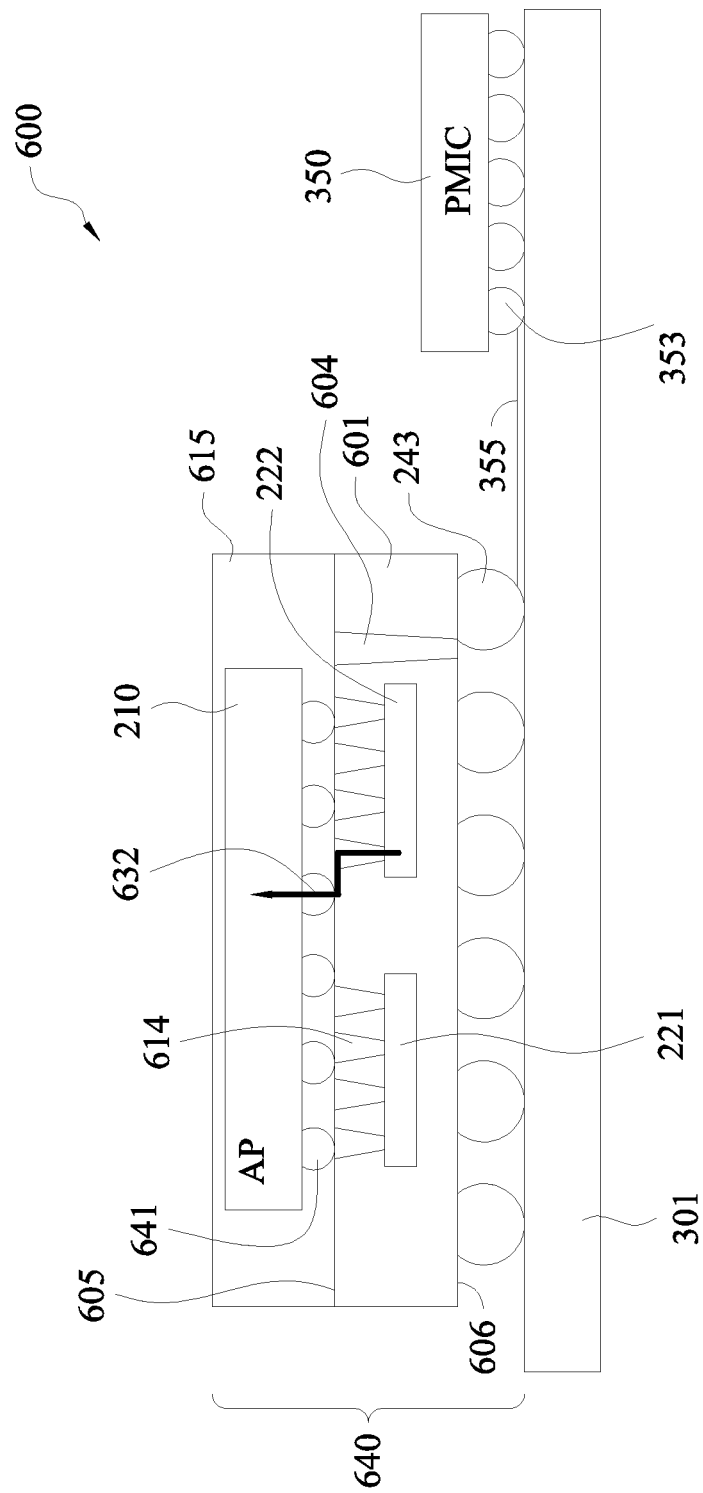

FIG. 6 is a schematic, cross-sectional view of a semiconductor device 600 in accordance with some embodiments. Compared to the semiconductor device 400, the semiconductor device 600 comprises a package 640 instead of the package 440. The package 640 comprises a device die 210, power supply dies 221, 222 and a further substrate 601. The power supply dies 221, 222 are embedded in the further substrate 601. In at least one embodiment, the further substrate 601 comprises an organic substrate. Other substrate configurations are within the scope of various embodiments.

In some embodiments, a cavity is formed in the further substrate 601, and the power supply dies 221, 222 are mounted inside the cavity. Conductive pillars 614 (e.g., copper pillars) are also formed in the cavity to extend from the power supply dies 221, 222 to an upper side 605 of the further substrate 601. Remaining spaces in the cavity are filled with a dielectric material (e.g., organic dielectric material). One or more through vias 604 are formed in the further substrate 601 to extend from the upper side 605 facing the device die 210 to a lower side 606 for electrical connections with corresponding one or more conductive bumps 243. An RDL (not shown) is formed on the upper side 605 of the further substrate 601. The device die 210 is connected to the RDL of the further substrate 601 via conductive bumps 641 in a manner similar to that described with respect to FIG. 5. Examples of conductive bumps 641 include, but are not limited to, copper pillars, and C4 bumps. A molding material 615 is molded over the device die 210, embedding the device die 210, and filling spaces between the conductive bumps 641.

Compared to embodiments described with respect to FIGS. 3-4, a power connection path 632 between a voltage regulator, e.g., voltage regulator VR2 on the power supply die 222, and the corresponding circuit in the device die 210 of the semiconductor device 600 includes an additional length corresponding to a height of the conductive pillars 614. In some embodiments, the height of the conductive pillars 614 is not greater than 200 µm, making it possible to still keep the power connection path length in an intended range, for example, not greater than 500 µm. The semiconductor device 600 operates and achieves one or more effects as described herein with respect to one or more of FIGS. 1A-1C, and 2-5.

Embodiments that combine different features and/or different embodiments are within the scope of the disclosure and will be apparent to those of ordinary skill in the art after reviewing various embodiments.

In some embodiments, at least one voltage regulator configured to supply power to a corresponding circuit in a device die is implemented in a power supply die which is separate from a PMIC and attached to the device die. As a result, a power connection path between the voltage regulator and the corresponding circuit is shortened which improves PDN impedance and provides one or more effects such as low voltage variation, low power consumption, reduced form factor, and the like.

In some embodiments, a semiconductor device comprises a device die, a first power supply die, and a second power supply die different from the first power supply die. The device die comprises a first circuit and a second circuit. The first power supply die is electrically coupled to the first circuit and configured to supply power for the first circuit. The second power supply die is electrically coupled to the second circuit and configured to supply power for the second circuit. The first and second power supply dies are attached to the device die, and overlap the device die in a thickness direction of the device die.

In some embodiments, a semiconductor device comprises a device die, a power supply die, and a power management die different from the power supply die. The power supply die is attached to the device die and comprises a voltage regulator configured to regulate and supply a power supply voltage to the device die. The power management die is electrically coupled to the power supply die, and configured to supply at least one of power or a control signal to the voltage regulator of the power supply die.

In some embodiments, a semiconductor device comprises a device die comprising a circuit, and a power supply die attached to the device die. The power supply die comprises a voltage regulator configured to regulate and supply a power supply voltage to the circuit. The power supply die overlaps the device die in a thickness direction of the device die. A length of a power connection path from the power supply die to the circuit is 500 µm or less.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a device die comprising a first circuit and a second circuit;
   an interposer comprising a first surface, a second surface opposite to the first surface, and a plurality of through vias extending from the first surface to the second surface, the device die being attached to the first surface of the interposer;
   a first power supply die attached to the second surface of the interposer, electrically coupled to the first circuit through the interposer, and configured to supply power for the first circuit; and
   a second power supply die different from the first power supply die, the second power supply die attached to the second surface of the interposer, electrically coupled to the second circuit through the interposer, and configured to supply power for the second circuit,
   wherein the first and second power supply dies overlap the device die in a thickness direction of the device die.

2. The semiconductor device of claim 1, wherein
   at least one of the first power supply die or the second power supply die overlaps the corresponding first circuit or second circuit in the thickness direction.

3. The semiconductor device of claim 1, wherein
   at least one of the first power supply die or the second power supply die includes a voltage regulator configured to regulate and supply a power supply voltage to the corresponding first circuit or second circuit.

4. The semiconductor device of claim 1, wherein
the first circuit and the second circuit have different first and second power supply voltages, and
the first and second power supply dies include corresponding first and second voltage regulators configured to regulate and supply the corresponding first and second power supply voltages to the corresponding first circuit and second circuit.

5. The semiconductor device of claim 1, wherein
each of the first and second power supply dies has a size, in a plan view of the device die, smaller than a size of the device die.

6. The semiconductor device of claim 1, further comprising:
a power management die different from the first and second power supply dies, the power management die electrically coupled to the first and second power supply dies, and configured to supply at least one of power or a control signal to each of the first and second power supply dies.

7. The semiconductor device of claim 1, wherein
the first circuit and the second circuit are selected from the group consisting of a central processing unit (CPU), a graphics processing unit (GPU), a digital signal processor (DSP), and an input/output (I/O) module.

8. The semiconductor device of claim 1, wherein
a length of a power connection path from at least one of the first power supply die or the second power supply die to the corresponding first circuit or second circuit is 500 μm or less.

9. The semiconductor device of claim 1, wherein
the first and second power supply dies are mounted side-by-side on a surface of the device die.

10. The semiconductor device of claim 1, further comprising:
a plurality of conductive bumps disposed between the device die and the first surface of the interposer, the plurality of conductive bumps bonding the device die to the interposer.

11. The semiconductor device of claim 1, further comprising:
a plurality of first conductive bumps disposed between the second surface of the interposer and the first power supply die, the plurality of first conductive bumps bonding the first power supply die to the interposer;
a plurality of second conductive bumps disposed between the second surface of the interposer and the second power supply die, the plurality of second conductive bumps bonding the second power supply die to the interposer; and
a plurality of third conductive bumps disposed between the first surface of the interposer and the device die, the plurality of third conductive bumps bonding the device die to the interposer,
wherein
the first power supply die is electrically coupled to the first circuit through at least one first conductive bump of the plurality of first conductive bumps, at least one through via of the plurality of through vias, and at least one third conductive bump of the plurality of third conductive bumps, and
the second power supply die is electrically coupled to the second circuit through at least one second conductive bump of the plurality of second conductive bumps, at least one through via of the plurality of through vias, and at least one third conductive bump of the plurality of third conductive bumps.

12. A semiconductor device, comprising:
a device die comprising a first circuit and a second circuit;
a first power supply die electrically coupled to the first circuit and configured to supply power to the first circuit;
a second power supply die electrically coupled to the second circuit and configured to supply power to the second circuit; and
an interposer between the device die and the first power supply die and between the device die and the second power supply die;
wherein, the first power supply die at least partially overlaps the first circuit and the second power supply die at least partially overlaps the second circuit.

13. The semiconductor device of claim 12, wherein
the first power supply die and the second power supply die are completely within an outer periphery of the device die, in a plan view of the device die.

14. The semiconductor device of claim 12, wherein
the first power supply die comprises a voltage regulator configured to provide different voltage levels to the first circuit.

15. The semiconductor device of claim 12, wherein
the first power supply die comprises a voltage regulator configured to turn off the first circuit.

16. The semiconductor device of claim 12, further comprising:
a power management die electrically coupled to the first power supply die and the second power supply die, and configured to supply a common power or a control signal to the first power supply die and the second power supply die.

17. A semiconductor device, comprising:
an interposer comprising a first surface and a second surface;
a device die comprising a first circuit and a second circuit, the first circuit and the second circuit being attached to the first surface of the interposer;
a first power supply die attached to the second surface of the interposer and configured to supply power to the first circuit through the interposer; and
a second power supply die attached to the second surface of the interposer and configured to supply power to the second circuit through the interposer.

18. The semiconductor device of claim 17, wherein
the interposer comprises at least one conductive layer alternating with at least one dielectric layer and is configured to provide electrical connections between the first circuit and the first power supply die and between the second circuit and the second power supply die.

19. The semiconductor device of claim 17, further comprising:
a power management die electrically coupled to the interposer and configured to supply at least one of a common power or a control signal to the first power supply die and the second power supply die through the interposer.

20. The semiconductor device of claim 17, further comprising:
a substrate;
a conductive bump disposed between the substrate and the interposer; and
a power management die attached to the substrate and electrically coupled to the interposer through the conductive bump and configured to supply at least one of a common power or a control signal to the first power supply die and the second power supply die through the interposer.

\* \* \* \* \*